US012027433B2

(12) United States Patent
Chen et al.

(10) Patent No.: US 12,027,433 B2
(45) Date of Patent: Jul. 2, 2024

(54) SEMICONDUCTOR PACKAGE AND METHOD FOR MAKING THE SAME

(71) Applicant: TAIWAN SEMICONDUCTOR MANUFACTURING COMPANY, LTD., Hsinchu (TW)

(72) Inventors: Yang-Che Chen, Hsinchu (TW); Chen-Hua Lin, Douliu (TW); Huang-Wen Tseng, Zhubei (TW); Victor Chiang Liang, Hsinchu (TW); Chwen-Ming Liu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/885,401

(22) Filed: Aug. 10, 2022

(65) Prior Publication Data
US 2022/0384281 A1 Dec. 1, 2022

Related U.S. Application Data

(63) Continuation of application No. 17/084,626, filed on Oct. 29, 2020, now Pat. No. 11,482,461.

(60) Provisional application No. 62/955,880, filed on Dec. 31, 2019.

(51) Int. Cl.
H01L 21/52 (2006.01)
H01L 23/00 (2006.01)
H01L 23/04 (2006.01)
H01L 23/06 (2006.01)
H01L 23/14 (2006.01)
(Continued)

(52) U.S. Cl.
CPC .............. *H01L 23/04* (2013.01); *H01L 21/52* (2013.01); *H01L 23/06* (2013.01); *H01L 23/14* (2013.01); *H01L 23/49816* (2013.01); *H01L 24/14* (2013.01); *H01L 2021/60022* (2013.01)

(58) Field of Classification Search
CPC ..................... H01L 21/52; H01L 24/14; H01L 2021/60022
See application file for complete search history.

(56) References Cited

U.S. PATENT DOCUMENTS 5,136,366 A    8/1992   Worp et al.
6,008,536 A   12/1999   Mertol
(Continued)

FOREIGN PATENT DOCUMENTS

KR    10-2004-0024164 A    3/2004
TW           I479577 B      4/2015

OTHER PUBLICATIONS

Non-Final Office Action issued in U.S. Appl. No. 17/084,626, dated Oct. 28, 2021.
(Continued)

Primary Examiner — Peniel M Gumedzoe
(74) Attorney, Agent, or Firm — STUDEBAKER & BRACKETT PC

(57) ABSTRACT

A semiconductor package includes a semiconductor chip disposed over a first main surface of a first substrate, a package lid disposed over the semiconductor chip, and spacers extending from the package lid through corresponding holes in the first substrate. The spacers enter the holes at a first main surface of the first substrate and extend beyond an opposing second main surface of the first substrate.

20 Claims, 9 Drawing Sheets

(51) Int. Cl.
*H01L 23/498* (2006.01)
*H01L 21/60* (2006.01)

(56) References Cited

U.S. PATENT DOCUMENTS

| | | | |
|---|---|---|---|
| 6,362,516 B1* | 3/2002 | Waters | H01L 25/105 174/16.3 |
| 6,724,078 B1 | 4/2004 | Sur et al. | |
| 6,822,867 B2 | 11/2004 | Hsieh | |
| 6,849,942 B2 | 2/2005 | Lin et al. | |
| 6,947,295 B2 | 9/2005 | Hsieh | |
| 7,145,084 B1 | 12/2006 | Sarihan et al. | |
| 8,987,922 B2 | 3/2015 | Yu et al. | |
| 8,993,380 B2 | 3/2015 | Hou et al. | |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,196,532 B2 | 11/2015 | Tu et al. | |
| 9,196,559 B2 | 11/2015 | Tsai et al. | |
| 9,257,333 B2 | 2/2016 | Lu et al. | |
| 9,263,511 B2 | 2/2016 | Yu et al. | |
| 9,263,839 B2 | 2/2016 | Chen et al. | |
| 9,275,924 B2 | 3/2016 | Wang et al. | |
| 9,275,925 B2 | 3/2016 | Chen et al. | |
| 9,281,254 B2 | 3/2016 | Yu et al. | |
| 9,299,649 B2 | 3/2016 | Chiu et al. | |
| 9,355,966 B2 | 5/2016 | Gallegos et al. | |
| 9,368,460 B2 | 6/2016 | Yu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 9,899,238 B2 | 2/2018 | Karhade et al. | |
| 2004/0066630 A1* | 4/2004 | Whittenburg | H01L 23/3733 257/E23.09 |
| 2004/0124517 A1 | 7/2004 | Hsieh et al. | |
| 2005/0067178 A1 | 3/2005 | Pearson et al. | |
| 2008/0099890 A1 | 5/2008 | Chen et al. | |
| 2011/0096507 A1* | 4/2011 | Deram | H01L 23/42 228/141.1 |
| 2014/0264820 A1* | 9/2014 | Hu | H01L 23/3736 257/713 |
| 2014/0287579 A1 | 9/2014 | Vijayen et al. | |
| 2015/0029670 A1* | 1/2015 | Ohnishi | C22C 13/00 420/560 |
| 2015/0137345 A1 | 5/2015 | Choi et al. | |

OTHER PUBLICATIONS

Final Office Action issued in U.S. Appl. No. 17/084,626, dated May 10, 2022.

Notice of Allowance issued in U.S. Appl. No. 17/084,626, dated Jun. 24, 2022.

* cited by examiner

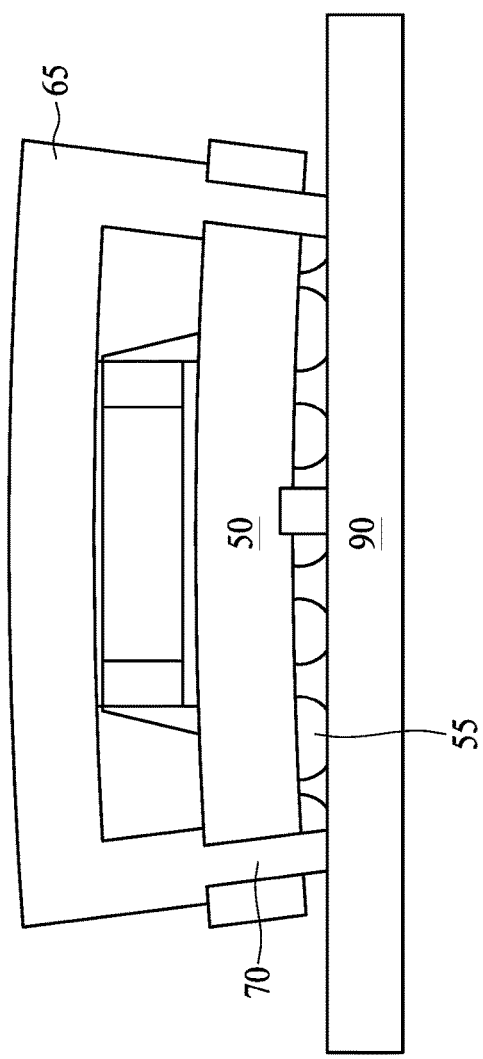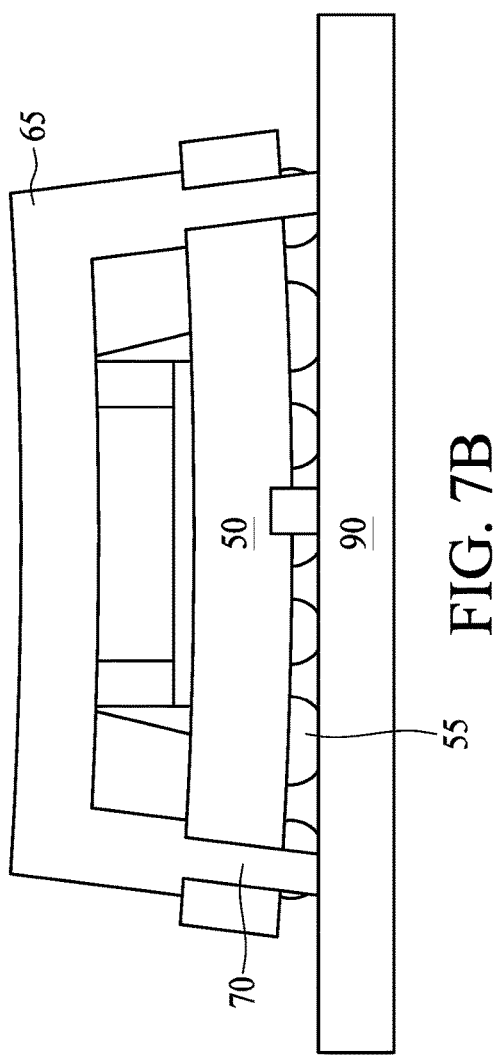
FIG. 7A
FIG. 7B

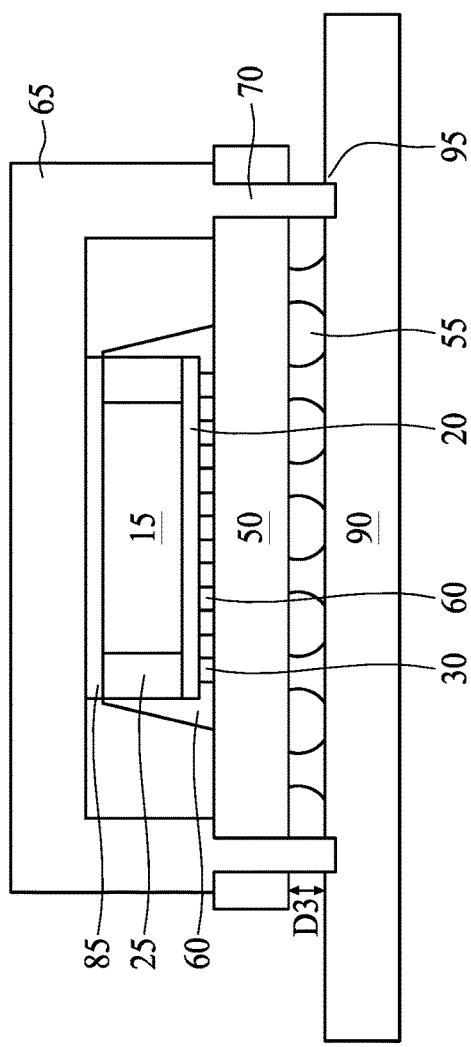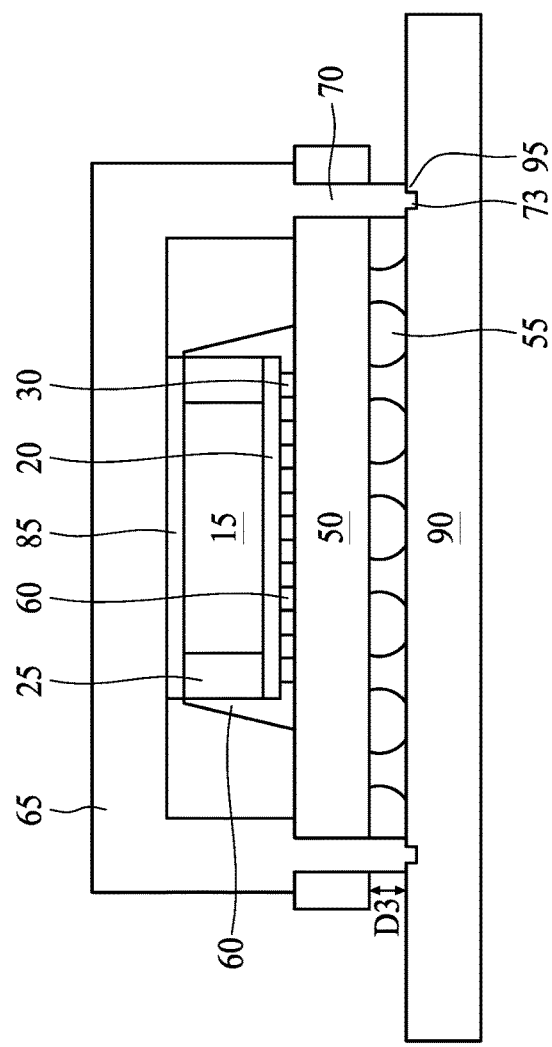

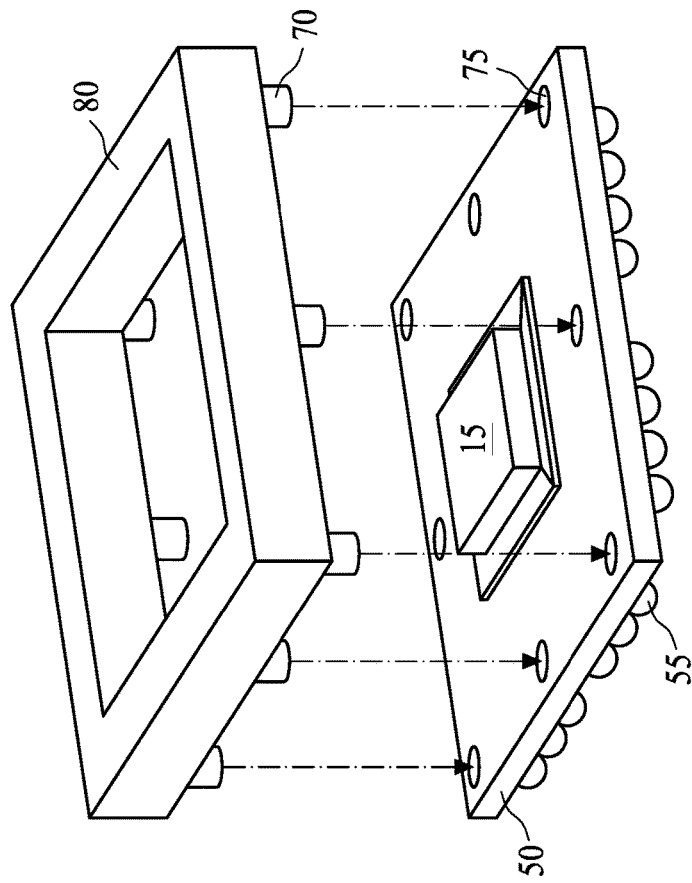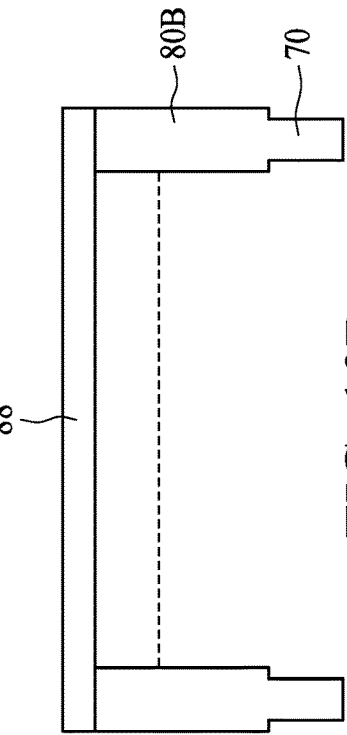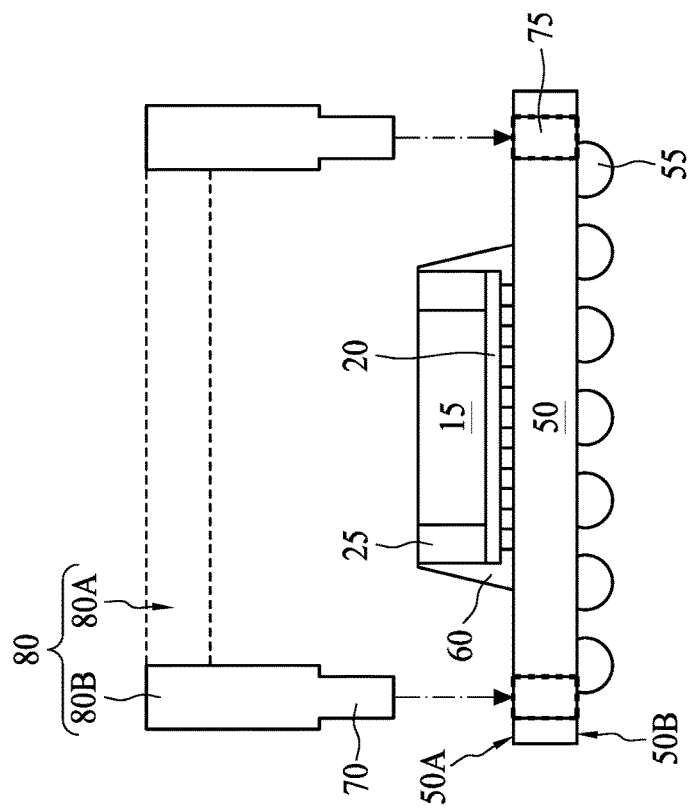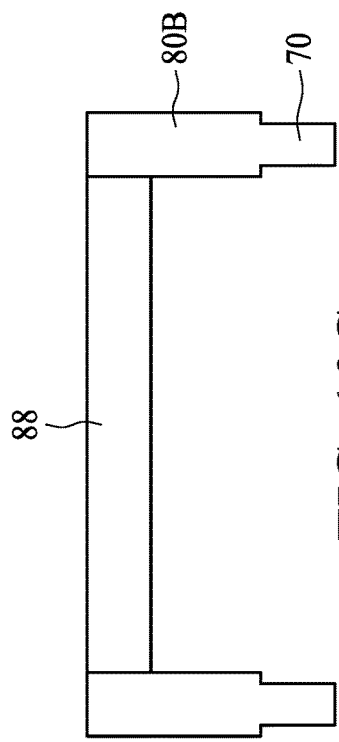
FIG. 10A
FIG. 10B
FIG. 10C
FIG. 10D

SEMICONDUCTOR PACKAGE AND METHOD FOR MAKING THE SAME

RELATED APPLICATION

This application is a continuation of U.S. patent application Ser. No. 17/084,626 filed Oct. 29, 2020, which claims priority to U.S. Provisional Patent Application No. 62/955,880 filed Dec. 31, 2019, the entire content of each of which is incorporated herein by reference.

BACKGROUND

With the increasing need of computation speed and heterogeneous integration, a greater number of silicon chips are assembled into a single package. As a result, multi-chip package size (>4000 mm$^2$) and weight are increasing. Heavier packages may distort ball grid arrays (BGAs) during surface mount technology (SMT) processes because melted solder bumps of the BGA may not be able to support the package weight. If the BGA is significantly deformed, such that adjacent solder bumps touch, bridging can happen and electrical short-circuits may result.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 7A and 7B illustrate semiconductor device packages according to embodiments of the present disclosure.

FIGS. 8A and 8B illustrate semiconductor device packages according to embodiments of the present disclosure.

FIGS. 10A and 10B illustrate one of the various stages of a sequential manufacturing operation of a semiconductor device package according to an embodiment of the present disclosure.

FIGS. 10C and 10D illustrate components of a semiconductor device package according to embodiments of the present disclosure.

DETAILED DESCRIPTION

Figure 1:
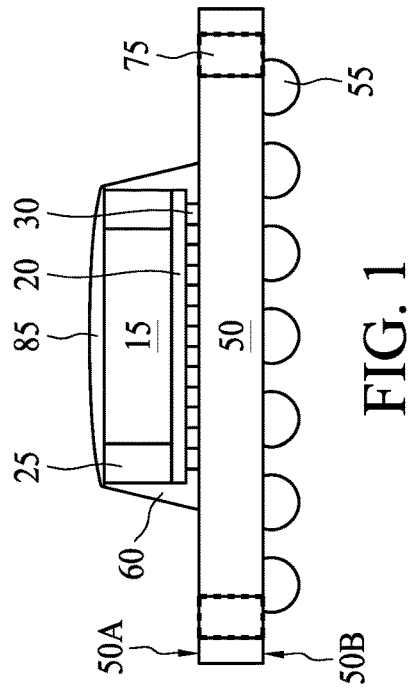
FIG. 1 illustrates one of the various stages of a sequential manufacturing operation of a semiconductor device package according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of" In the present disclosure, a phrase "one of A, B and C" means "A, B and/or C" (A, B, C, A and B, A and C, B and C, or A, B and C), and does not mean one element from A, one element from B and one element from C, unless otherwise described.

Packages for a semiconductor device includes various materials having different coefficients of thermal expansion (CTE). Accordingly, the package may be bent during the surface mount technology processing because of the coefficient of thermal expansion mismatch. In particular, when the mismatch in the coefficient of thermal expansion between a package lid of the package and a substrate is large, the package tends to be bent. In some embodiments, the package lid of the package is made of Cu having a coefficient of thermal expansion of about 17×10$^{-6}$ C$^{-1}$, and the package substrate is made of a polymeric material having a coefficient of thermal expansion of about 10×10$^{-6}$ C$^{-1}$, at high temperatures. In such a case, the substrate bends convexly toward the package lid (crying-face warpage), and the bent substrate squeezes the melted solder bumps disposed on the back side of the package substrate closer to each other, especially the solder bumps at the corner of the BGA. As the BGA is deformed, neighboring solder bumps may touch and cause bridging, thereby causing unwanted electrical short circuits.

On the other hand, if the package substrate has a higher coefficient of thermal expansion than the package lid, an opposite condition of the package having a concave shape toward the package lid (a smiling-face warpage) happens during the surface mounting processing. Under this condition, solder bumps in the center may form a bridge.

Embodiments of the present disclosure provide a spacer structure that keeps BGAs from deforming and prevents solder ball bridging. Some embodiments of the disclosure are directed to three dimensional (3D) IC package technologies, including an integrated fan out (InFO) package, a chip on wafer on substrate (CoWoS) package, and a multiple chip module (MCM). Other suitable packages are employed in some embodiments. It is desirable to maintain a uniform gap between the package substrate and a printed circuit board (PCB) during the entire surface mounting processing in some embodiments.

FIGS. 1-6 illustrate a sequential manufacturing operation of a semiconductor device package according to an embodiment of the present disclosure. It is understood that additional operations can be provided before, during, and after processes shown by FIGS. 1-16, and some of the operations described below can be replaced or eliminated, for additional embodiments of the method. The order of the operations/processes may be interchangeable.

As shown in FIG. 1, a semiconductor chip 15 is molded over a package substrate 50. In some embodiments, the semiconductor chip 15 is an integrated fan-out chip, system on a chip, wafer-level chip scale package, or chip on wafer on substrate. In some embodiments, the semiconductor chip 15 is placed on a lead frame or connected to a re-distribution layer (wiring) 20. In some embodiments, the package is a flip chip package, and the semiconductor chip 15 is embedded in a molding 25, such as a thermoset resin. Further, the lead frame or the re-distribution layer 20 is connected to conductive pillars or solder bumps 30.

The redistribution layer 20 is formed with one or more metal layers and one or more inter-metal dielectric layers. The inter-metal dielectric layers are disposed between the metal layers. Conductive features, such as vias, are disposed in a dielectric material of the inter-metal dielectric layers have to connect conductive features, such as traces or wirings, in the metal layers. In some embodiments, the dielectric material is, for example, a silicon oxide, nitride, carbide, polymer, or another insulating or dielectric material, and may be formed using a chemical vapor deposition (CVD), spin-on or other deposition process. The conductive features may be formed using a damascene or dual damascene process, with openings etched in the dielectric layer of the redistribution layer 20, and a conductive material such as copper, aluminum, or the like deposited in the opening and then planarized. The redistribution layer is built up by forming multiple metal layers and inter-metal dielectric layers, with the traces and vias routing electrical connections from conductive structures on the package substrate 50 on which the semiconductor chip 15 is subsequently disposed to the top surface of the redistribution layer 20.

The package substrate 50 has a first main surface 50A, on which the semiconductor chip 15 is attached via the pillars or solder bumps 30 on the redistribution layer 20, and a second main surface 50B including an array of solder balls (ball grid array) 55. In some embodiments, conductive vias or wiring layers are formed in the package substrate 50 electrically connecting the pillars or solder bumps 30 on the redistribution layer to the solder balls 55 on the second main surface 50B of the substrate 50. In some embodiments, the package substrate 50 is made of an insulating material, such as resin or ceramic.

The semiconductor chip 15 with lead frame or the re-distribution layer 20 is attached to the package substrate by under-fill material 60. The under fill material 60 is applied to the side of the molding 25 and the space under the bottom of the semiconductor chip 15 and the upper surface 50A of the package substrate 50. The under-fill material 60 fills the region between the pillars or solder bumps 30. In some embodiments, the under-fill material 60 is also disposed over the sides of the semiconductor chip 15. In some embodiments, the under-fill material 60 is an epoxy resin, such as a silica filled epoxy resin, a polyimide, or other suitable insulating material. The under-fill material 60 increases mechanical reliability by distributing stresses across the top of the package substrate 50 rather than allowing them to become concentrated in the pillar or solder bumps 30. In addition, the under-fill material 60 provides encapsulation from moisture and contaminants in the external environment.

In some embodiments, a thermal interface material (TIM) 85 is disposed over the semiconductor chip 15. The thermal interface material 85 includes a solder material, such as a tin-containing alloy (e.g., PbSn, AgSn, SnAgCu, CuSnNi, AgCuSbSn, AuSn, and/or CuSn). In some embodiments, the PbSn solder has a thermal conductivity of about 50 W/mK, the AgSn solder has a thermal conductivity of about 78 W/mK, the SnAgCu solder has a thermal conductivity of about 60 W/mK, the CuSnNi has a thermal conductivity of about 64 W/mK, the AgCuSbSn solder has a thermal conductivity of about 57 W/mK, the AuSn solder has a thermal conductivity of about 57 W/mK, and the CuSn solder has a thermal conductivity of about 65 W/mK. In some embodiments, a pad layer (not shown) is formed between the semiconductor chip 15 and the thermal interface material 85. In some embodiments, the pad layer is formed of a suitable conductive metal, including aluminum, copper, silver, gold, nickel, tungsten, titanium, alloys thereof, and/or multilayers thereof.

In some embodiments, the thermal interface material 85 is thermally conductive gel, paste, pad, grease, or phase change materials with thermal conductivities, between about 0.5 W/mK and 10 W/mK. In some embodiments, the thermal grease may be a ceramic or metal, such as beryllium oxide, aluminum nitride, aluminum oxide, zinc oxide, silver, aluminum, or the like, suspended in a silicone-based gel. In some embodiments, the thermal interface material 85 is a liquid metal paste of gallium alloys, or a metal alloy pad that is reflowed to adhere the thermal interface material to a surface. In some embodiments, the thermal interface material is a non-electrically conductive, ceramic-based paste filled with ceramic powders, such as beryllium oxide, aluminum nitride, aluminum oxide, or zinc oxide.

Figure 2B:
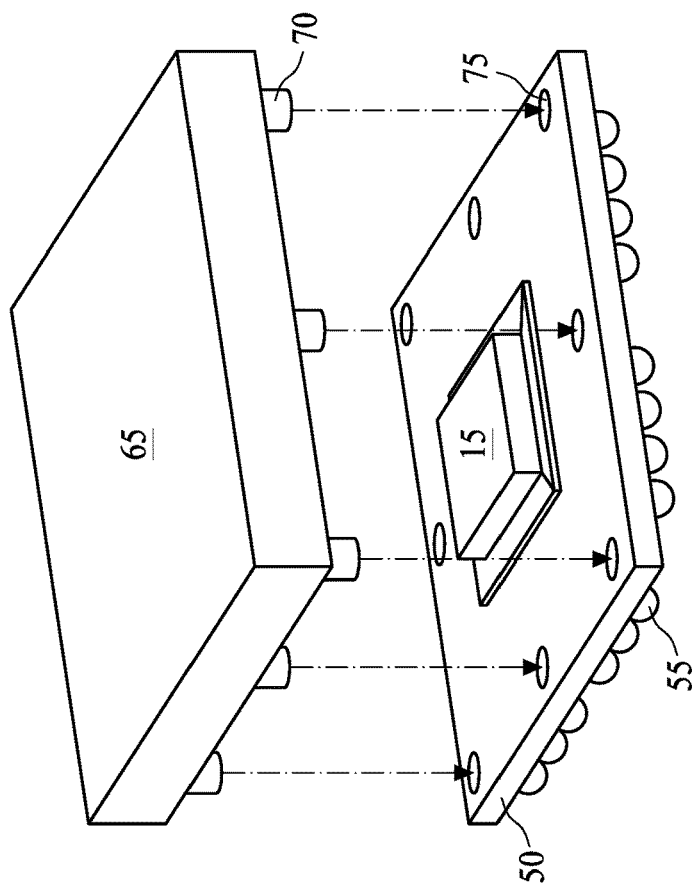
FIGS. 2A and 2B illustrate one of the various stages of a sequential manufacturing operation of a semiconductor device package according to an embodiment of the present disclosure.
Figure 2A:
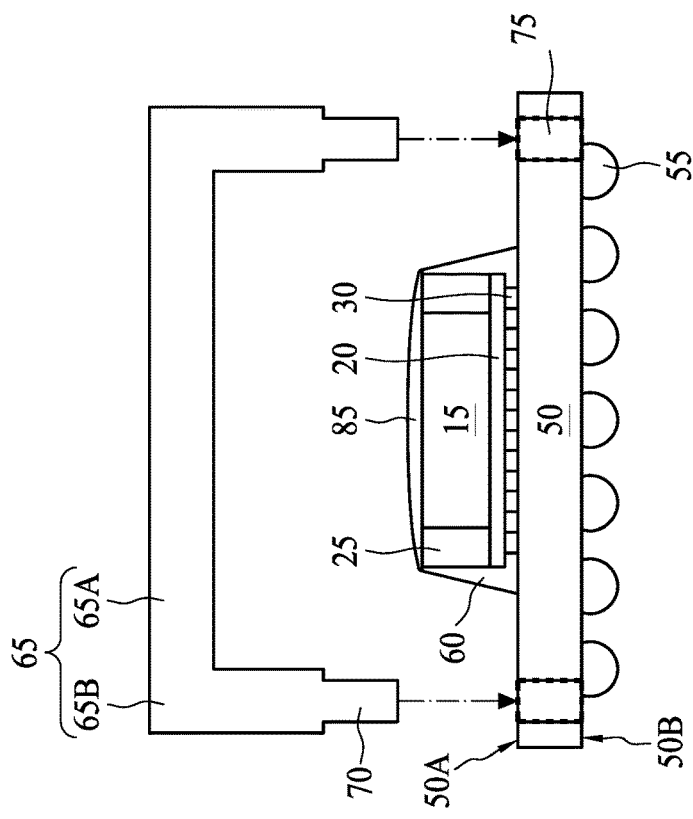

As shown in FIGS. 2A and 2B, a package lid 65 is subsequently positioned over the package substrate with the semiconductor chip 15. The package lid 65 functions as a heat sink to dissipate heat generated by the semiconductor chip 15. The package lid 65 is made of a heat conductive material. In some embodiments, the package lid is made of aluminum, copper, nickel, cobalt, and alloys thereof, or other thermally conductive materials. In some embodiments, the package lid 65 is made of Cu alloys, such as CuMo, CuW, or CuBe. In some embodiments, the package lid is made of a composite material, including ceramic, silicon carbide, aluminum nitride, graphite, and the like.

As shown in FIGS. 2A (cross sectional view) and 2B (perspective view), the package lid 65 includes a ceiling portion 65A and a wall portion 65B, and further a plurality of spacers 70 extending from the bottom of the wall portion 65B. The spacers 70 are integrally formed with the package lid 65 as a one piece element. In some embodiments, the package lid 65 has a square shape in plan view. As shown in FIGS. 2A and 2B, a plurality of through holes 75 are formed in the package substrate 50 passing through from the front surface 50A to the rear surface 50B, to receive the plurality of spacers 70, respectively. The through holes 75 are made by a standard drilling process or a laser drilling process in some embodiments. A height of the wall portion 65B is in a range from about 0.5 mm to 5 mm and a thickness of the wall portion 65B is in a range from about 1 mm to 10 mm.

In some embodiments, the spacers 70 are disposed at the four corners of the wall part and one or more spacers are disposed between the corner spacers along the sides of the wall portion 65B. In some embodiments, one spacer is disposed between the corner spacers at the center of each side (the total number of the spacers is 8). In other embodiments, two spacers are disposed between the corner spacers at to equal interval between the spaces including the corner spacers at each side (the total number of the spacers is 12). The numbers of the spacers 70 are not limited, and in some embodiments, 3-20 spacers are disposed between the corner spacers at each side of the wall portion 65B. In some embodiments, the number of spacers 70 and the interval (pitch) at each side are the same. In some embodiments, no spacers are disposed at the corners of the wall portion 65B.

In some embodiments, the pitch of the spacers 70 is greater than the pitch of the ball grid array 55. In some embodiments, the ball grid array has a pitch ranging from about 200 µm to about 800 µm. In some embodiments, the pitch of the spacers 70 is in a range from about 1 mm to about 10 mm, and is in a range from about 2 mm to about 5 mm in other embodiments.

When the shape of the package lid (in plan view) is rectangular (not square), the number of spacers 70 at each side is different between the short sides and the long sides. In some embodiments, the number of spacers 70 at each side is the same for the short sides and the long sides. In some embodiments, the spacers 70 are arranged with the same interval (pitch) for both the short sides and the long sides, and in other embodiments, the interval of the spacers 70 at the short sides is different from that at the long sides.

In some embodiments, the spacers 70 have a column shape with a circular cross section. In other embodiments, the cross sectional shape is rectangular including a square, oval, or polygonal (e.g., hexagonal). The cross sectional shape of the spacers matches the cross sectional shapes of the through holes 75 in the package substrate. The tolerance of the spacers 70 and through holes 75 are maintained so that there is a close fit between the spacers 70 and through holes 75. In some embodiments, the diameter of the spacer 70 is in a range from about 100 µm to about 2 mm, and is in a range from about 500 µm to about 1 mm in other embodiments. In some embodiments, the diameter of the spacers 70 is 0.5%-5% larger than the diameter of the through holes. In some embodiments, the diameter of the spacers is about 1 µm to about 10 µm greater than the diameter of the through holes 75. When the diameter of the spacers is greater than the diameter of the through holes 75, the package substrate 50 is made of more flexible or softer material than the spacers 70 so that the spacers 70 are press-fitted to the through holes 75.

In other embodiments, the diameter of the spacers 70 is equal to or smaller than the diameter of the through holes. In some embodiments, the diameter of the spacers 70 is 0.5%-5% smaller than the diameter of the through holes. In some embodiments, the diameter of the spacers is about 10 µm to about 50 µm smaller than the diameter of the through holes 75.

In some embodiments, the diameter of the spacers 70 is equal to or smaller than the thickness of the wall portion 65B. In some embodiments, the diameter of the spacers 70 is about 30% to about 100% of the thickness of the wall portion 65B and is in a range from about 50% to about 80% of the thickness of the wall portion 65B in other embodiments.

The height of the spacers 70 is larger than the thickness of the package substrate 50 so that the spacers 70 extend beyond the rear surface 50B of the package substrate 50 when the package lid 65 is assembled to the package substrate 50. In some embodiments, the protruding amount D1 (see, FIG. 5A) of the spacers 70 is the same as or smaller than the thickness D2 of the solder balls 55 from the rear surface 50B.

Figure 3:
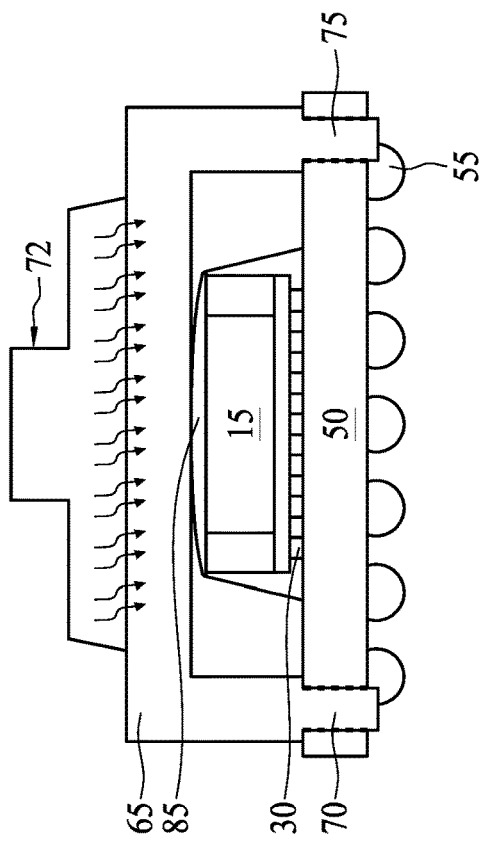
FIG. 3 illustrates one of the various stages of a sequential manufacturing operation of a semiconductor device package according to an embodiment of the present disclosure.

Then, as shown in FIG. 3, the package lid 65 is attached to the package substrate 50 by inserting the spacers 70 inserted into the through holes 75. In some embodiments, the package lid 65 is press-fitted to the package substrate 50.

Figure 4:
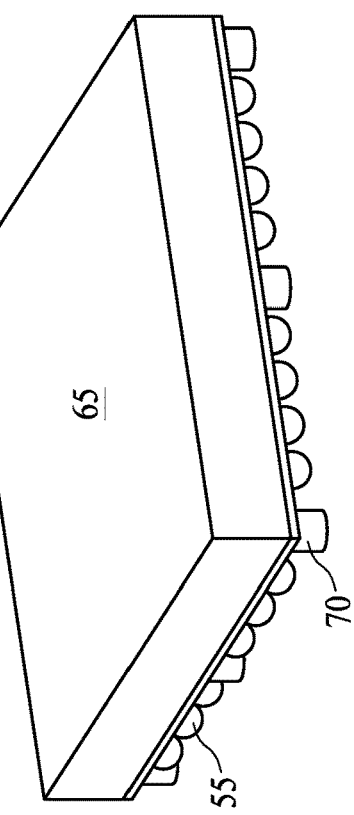
FIG. 4 illustrates one of the various stages of a sequential manufacturing operation of a semiconductor device package according to an embodiment of the present disclosure.
Figure 5A:
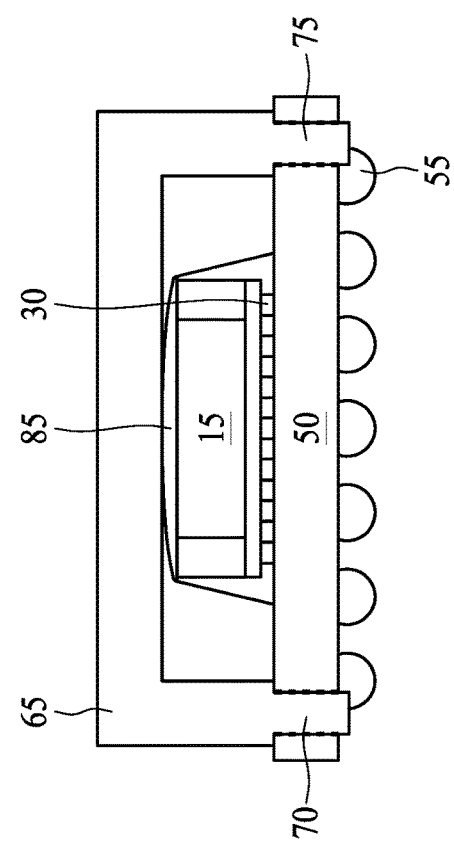
FIGS. 5A and 5B illustrate one of the various stages of a sequential manufacturing operation of a semiconductor device package according to an embodiment of the present disclosure.

Then, the package lid 65 is heated and pressed into intimate contact with the semiconductor chip 15 via the solder layer (thermal interface material) 85, such as by using a thermal compressive bond head 72, as shown in FIG. 4, thereby resulting in a semiconductor device with the package lid 65 bonded to chip 15 and the package substrate 50, as shown in FIGS. 5A (cross sectional view) and 5B (perspective view).

During the application of the heat and pressure to the package lid 65, the solder layer (thermal interface material) 85 flows to form a continuous and substantially flat solder layer between the package lid 65 and chip 15. In some embodiments, the thermal compressive bond head 72 heats the solder layer 85 to a temperature of about 150° C. to about 400° C. In some embodiments, the solder layer 85 is heated to a temperature of about 200° C. to about 300° C. In an embodiment, the solder layer 85 is heated to a temperature of about 250° C. In some embodiments, the pressure applied while pressing the package lid 65 into contact with the semiconductor chip 15 ranges from about 50 kPa to about 20 MPa. In some embodiments, the pressure applied ranges from about 300 kPa to about 3 MPa. In some embodiments, the pressure applied ranges from about 500 KPa to about 2 MPa. The continuous solder layer 85 functions as an improved thermal interface material (TIM) layer that has sufficient thermal conductivity to radiate heat from the semiconductor chip 15. Heat from the semiconductor chip 15 is transferred to the package lid 65 by way of the continuous thermal interface material 85. The package lid 65 dissipates the heat of chip 15, permitting the semiconductor chip 15 to operate at higher speeds and with less thermal stress.

In some embodiments, when the diameter of the spacers 70 of the package lid 65 is smaller than the diameter of the through holes 75 of the package substrate 50, an adhesive material (e.g., epoxy resin adhesive) is used to fix the spacers 70 to the package substrate 50.

Figure 5B:
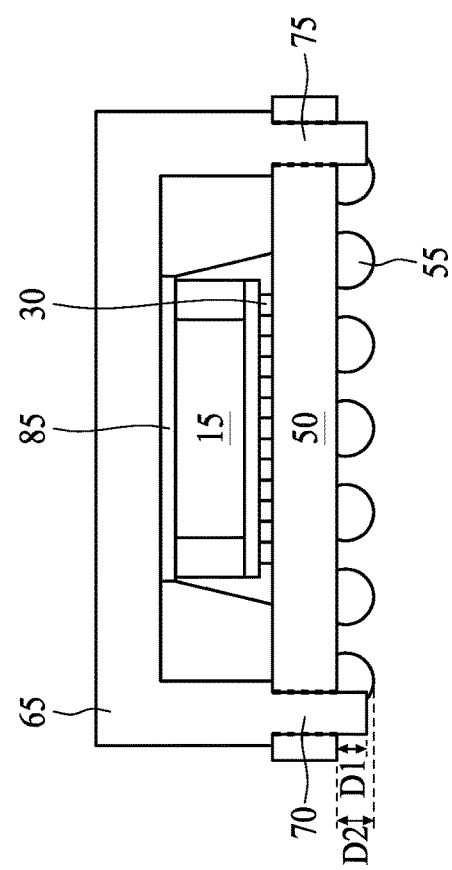
Figure 6:
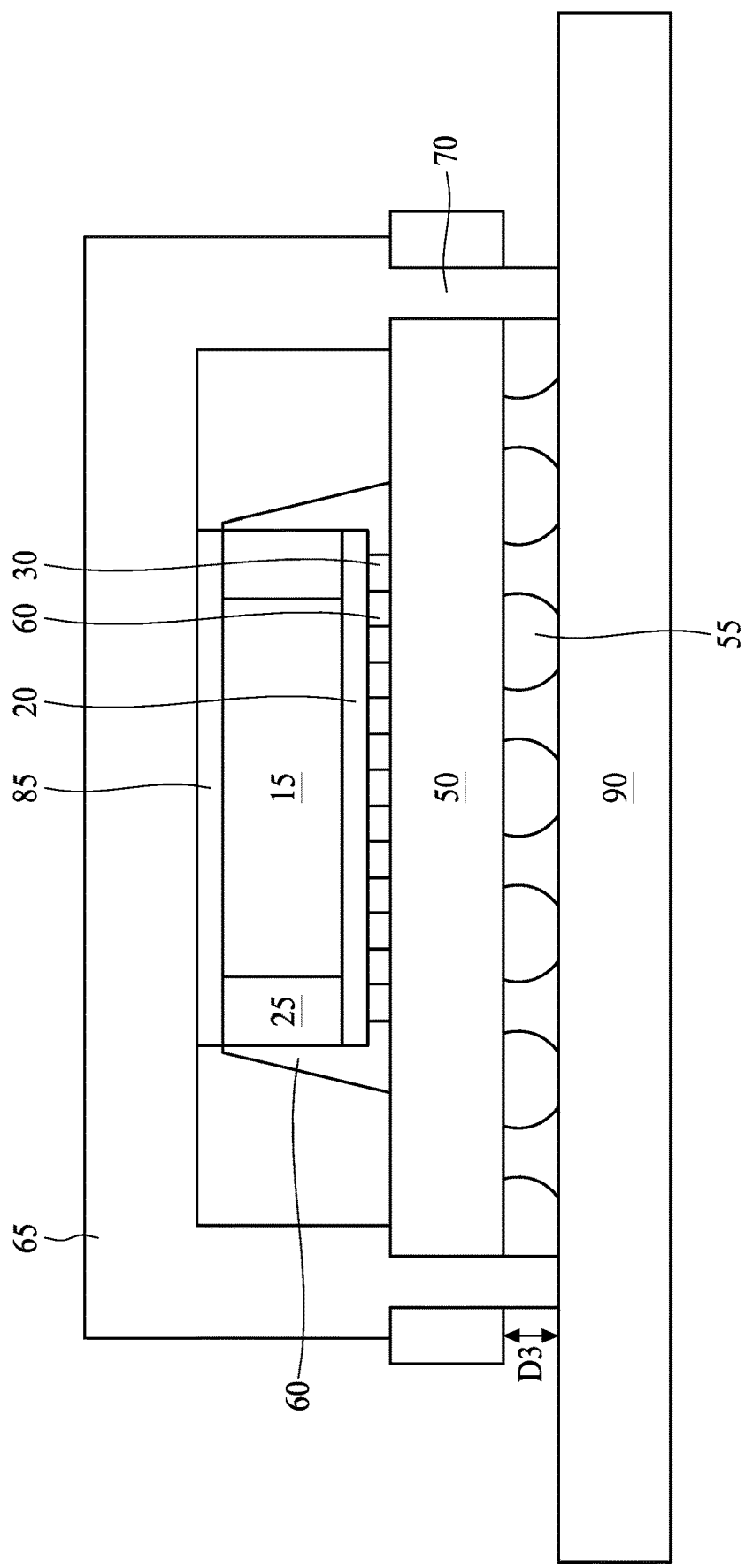
FIG. 6 illustrates one of the various stages of a sequential manufacturing operation of a semiconductor device package according to an embodiment of the present disclosure.

Then, the packaged semiconductor device shown in FIGS. 5A and 5B is mounted on a board 90, such as a printed circuit board (PCB), as shown in FIG. 6. In some embodiments, a surface mounting process is used to mount the packaged semiconductor device to the printed circuit board 90.

During the surface mounting process, heat is applied to at least partially melt the solder balls 55 of the ball grid array to bond the solder balls 55 to electrode pads formed on the printed circuit board 90, respectively. As shown in FIG. 6, the spacers 70 of the lid 65, which is made of a rigid material, maintain a uniform and sufficient gap between the rear surface 50B of the package substrate 50 and the printed circuit board 90. Accordingly, pressure applied to the solder balls 55 of the ball grid array is uniform, which can prevent undesirable deformation of the solder balls 55. In some embodiments, the variation in distance of the gap between the rear surface 50B of the package substrate 50 is about 1% to about 5% of the average distance of the gap (e.g., when measured at 20-50 points).

FIGS. 7A and 7B also show the effect of the spacers 70. As set forth above, due to the differences in coefficient of thermal expansion between the package substrate 50 and the package lid 65, the packaged semiconductor device may be bent. FIG. 7A shows frowning-face warpage (upwardly convex) and FIG. 7B shows smiling face warpage (downwardly convex). In both cases, the spacers 70 between the rear surface 50B of the package substrate 50 and the printed circuit board 90 prevent the solder balls 55 from bridging or deforming.

In some embodiments, a distance D3 (gap or space) between the rear surface 50B of the package substrate 50 and the printed circuit board 90, as shown in FIGS. 8A and 8B, is in a range from about 20 μm to about 800 in other embodiments, the distance is in a range from about 50 μm to about 500 In certain embodiments, the distance is in a range from about 100 μm to about 400 In other words, the protruding amount D1 of the spacer 70 (see, FIG. 5A) is set to be equal to the distance D3.

In some embodiments, the spacers 70 of the package lid 65 are fixed to the printed circuit board 90 by an adhesive material (e.g., epoxy resin adhesive). In such a case, the protruding amount D1 of the spacer 70 is slightly smaller than the distance D3 due to the thickness of the adhesive material.

In other embodiments, a part of the spacers 70 is embedded in the printed circuit board 90. In some embodiments, shallow holes 95 are formed in the upper surface of the circuit board 90 for the ends of the spacers 70 to fit into the shallow holes, as shown in FIG. 8A. The depth of the shallow holes 95 is in a range from about 5 μm to about 200 μm in some embodiments. In such a case, the protruding amount D1 of the spacer 70 is greater than the distance D3 by the depth of the shallow holes 95.

Further, in some embodiments, as shown in FIG. 8B, the ends of the spacers 70 have a narrow portion 73 having a smaller diameter. The narrow portion 73 is fit into the shallow holes 95 in some embodiments. In some embodiments, the narrow portion 73 has a conical shape. The configurations shown in FIGS. 8A and 8B can more rigidly or tightly secure the gap or space between the rear surface 50B of the package substrate 50 and the printed circuit board 90.

FIGS. 9A-9D show various configurations of the package lid 65 according to embodiments of the present disclosure.

Figure 9A:
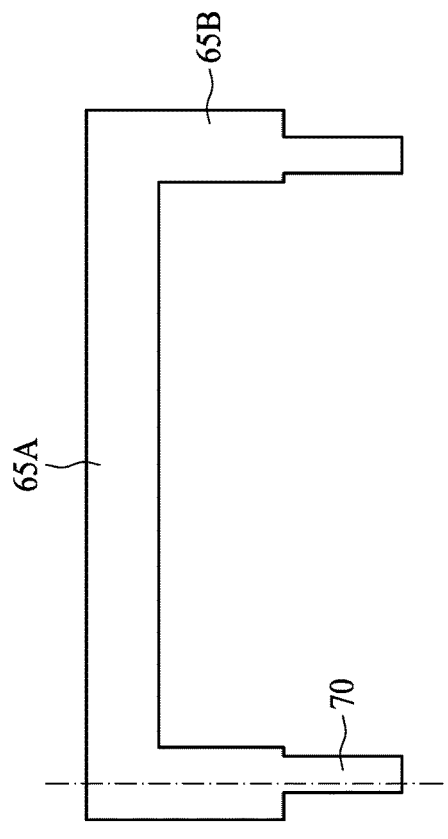
FIGS. 9A, 9B, 9C and 9D illustrate components of a semiconductor device package according to embodiments of the present disclosure.
Figure 9B:
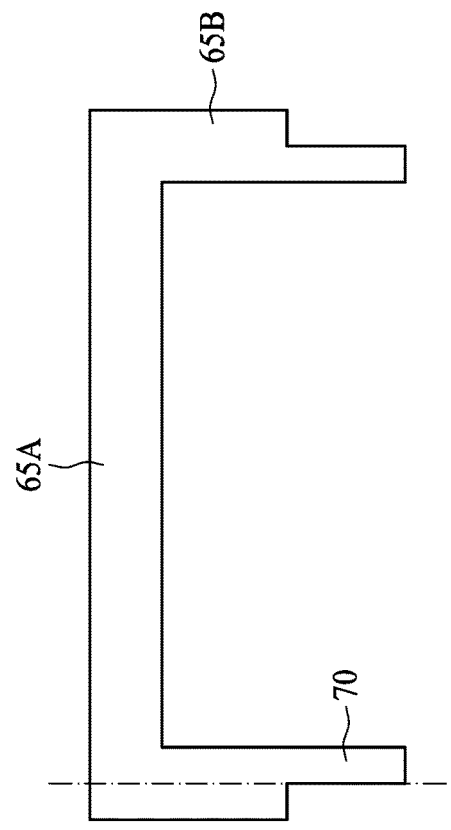
Figure 9C:
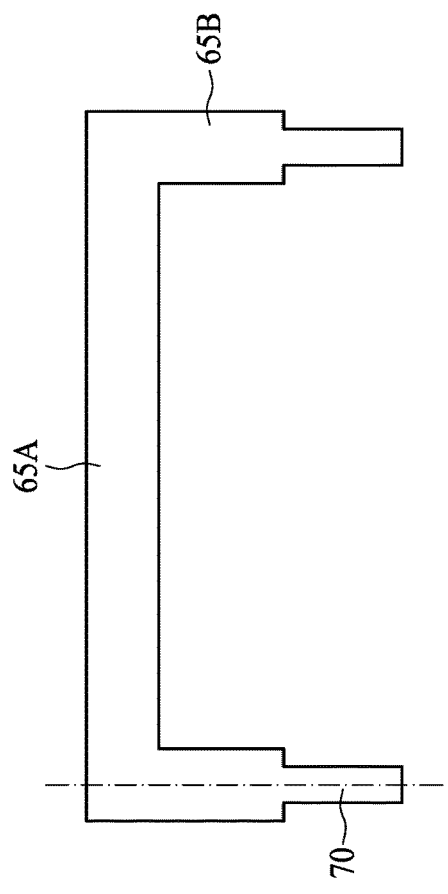
Figure 9D:
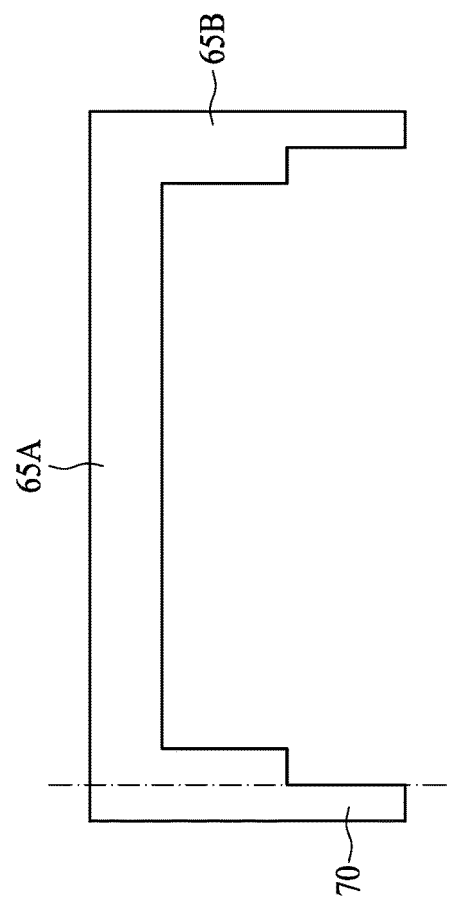

In some embodiments, the center of the spacers 70 is aligned with the center of the wall portion 65B as shown in FIG. 9A. In other embodiments, the center of the spacers 70 is shifted inwardly or outwardly from the center of the wall portion 65B as shown in FIG. 9B. In certain embodiments, the outer surface of the wall portion 65B is flush with the outermost portion of the spacer 70 as shown in FIG. 9C, and in other embodiments, the inner surface of the wall portion 65B is flush with the innermost portion of the spacer 70 as shown in FIG. 9D. Depending on the device configuration (e.g., arrangement of the ball grid array 55), a suitable configuration of the spacers 70 is selected. Embodiments of the spacers 70 accommodate various designs of different ball sizes and pitches of the solder balls 55 of the ball grid array.

Embodiments of the present disclosure can also allow processing temperatures of up to 260° C. without substantial deformation of the package substrate, thereby preventing bridging and short circuits.

FIGS. 10A and 10B show an open-lid with a ring or frame shape according to embodiments of the present disclosure. Materials, configurations, dimensions, structures, conditions and operations the same as or similar to those explained with FIGS. 1-9D may be employed in the following embodiments, and some of the explanations may be omitted.

In some embodiments, the semiconductor chip 15 includes an image sensor, such as a charge coupled device (CCD) device or a CMOS image sensor, which receives light from outside and generates an image signal corresponding to the light. In some embodiments, the semiconductor chip 15 is a light (e.g., infrared light) sensor. In such a case, the package should have an opening to receive incident light.

As shown in FIGS. 10A and 10B, instead of the closed package lid 65 shown above, an open lid 80 having a ring or a frame shape is used. Similar to the closed lid 65, the open lid 80 includes a wall portion 80B surrounding an opening 80A and a plurality of spacers 70 protruding from the bottom of the wall portion 80B.

The open lid 80 is made of a heat conductive material. In some embodiments, the open lid 80 functions as a heat sink to dissipate heat generated by the semiconductor chip 15. However, unlike the closed lid 65, no heat conductive path is provided between the top of the semiconductor chip 15 to the closed lid 65 (no ceiling portion and no thermal interface material), and thus the semiconductor chip 15 used with the open lid 80 generates less heat than that used with the closed lid 65. In other embodiments, an external heat sink is attached to the semiconductor chip 15 through the opening 80A, or a cooling fan is provided above the opening 80A to cool the semiconductor chip 15.

In some embodiments, the open lid 80 is made of aluminum, copper, nickel, cobalt, and alloys thereof, or other thermally conductive materials. In some embodiments, the open lid 80 is made of Cu alloys, such as CuMo, CuW, or CuBe. In some embodiments, the open lid 80 is made of a composite material, including silicon carbide, aluminum nitride, graphite, and the like. In some embodiments, the open lid 80 is made of a composite material, including ceramic, silicon carbide, aluminum nitride, graphite, and the like.

In some embodiments, a transparent sheet 88 is placed in the opening 80A as shown in FIG. 10C or covers the opening 80A as shown in FIG. 10D, to protect the semiconductor chip 15. In some embodiments, the transparent sheet is made of glass or plastic. In some embodiments, the transparent sheet passes visible light and/or infrared light.

In some embodiments, a height of the wall portion 80B is equal to or smaller than the height of the semiconductor chip 15 measured from the front surface 50A of the package substrate 50. In other embodiments, the height of the wall portion 80B is greater than the height of the semiconductor chip 15.

In some embodiments, the inside of the wall portion is coated with a light absorbing material, or has a roughened surface. The roughness Ra of the roughened surface is in a range from about 1 μm to about 100 μm in some embodiments.

Further, in some embodiments, a transparent resin is filled to cover the semiconductor chip 15 in the open lid 80 to protect the semiconductor chip 15.

Figure 11A:
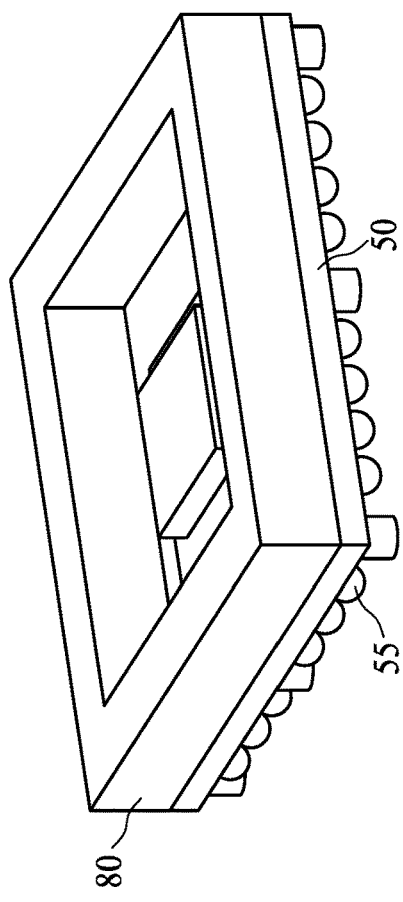
FIGS. 11A and 11B illustrate one of the various stages of a sequential manufacturing operation of a semiconductor device package according to an embodiment of the present disclosure.
Figure 11B:
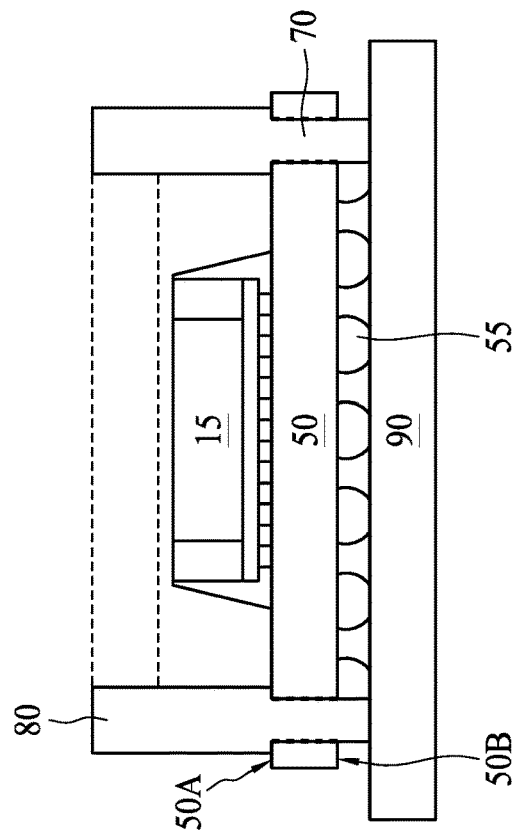

Similar to FIGS. 5A and 5B, the open lid 80 is attached to the package substrate 50 by inserting the spacers 70 into the through holes 75 by press fitting, as shown in FIGS. 11A and 11B.

When the diameter of the spacers 70 of the open lid 80 is smaller than the diameter of the through holes 75 of the package substrate 50, an adhesive material (e.g., epoxy resin adhesive) is used to fix the spacers 70 to the package substrate 50 in some embodiments.

Figure 12:
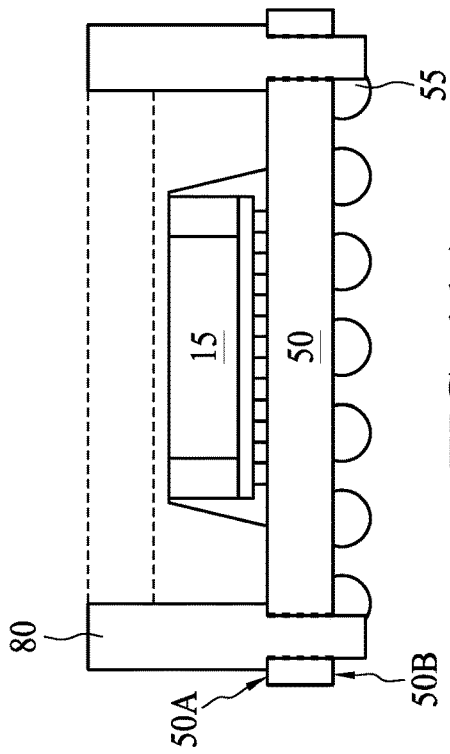
FIG. 12 illustrates one of the various stages of a sequential manufacturing operation of a semiconductor device package according to an embodiment of the present disclosure.

Then, the packaged semiconductor device shown in FIGS. 11A and 11B is mounted on a board 90, such as a printed circuit board (PCB), as shown in FIG. 12. In some embodiments, a surface mounting process is used to mount the packaged semiconductor device to the printed circuit board 90.

During the surface mounting process, heat is applied to at least partially melt solder balls 55 of ball grid array to bond the solder balls 55 to electrode pads formed on the printed circuit board 90, respectively. As shown in FIG. 12, the spacers 70 of the open lid 80, which is made of a rigid material, maintain a uniform and sufficient gap between the rear surface 50B of the package substrate 50 and the printed circuit board 90. Accordingly, pressure applied to the solder balls 55 of the ball grid array is uniform, which can prevent undesirable deformation of the solder balls 55. In some embodiments, the variation in distance of the gap between the rear surface 50B of the package substrate 50 is about 1% to about 5% of the average distance of the gap (e.g., when measured at 20-50 points).

Figure 13:
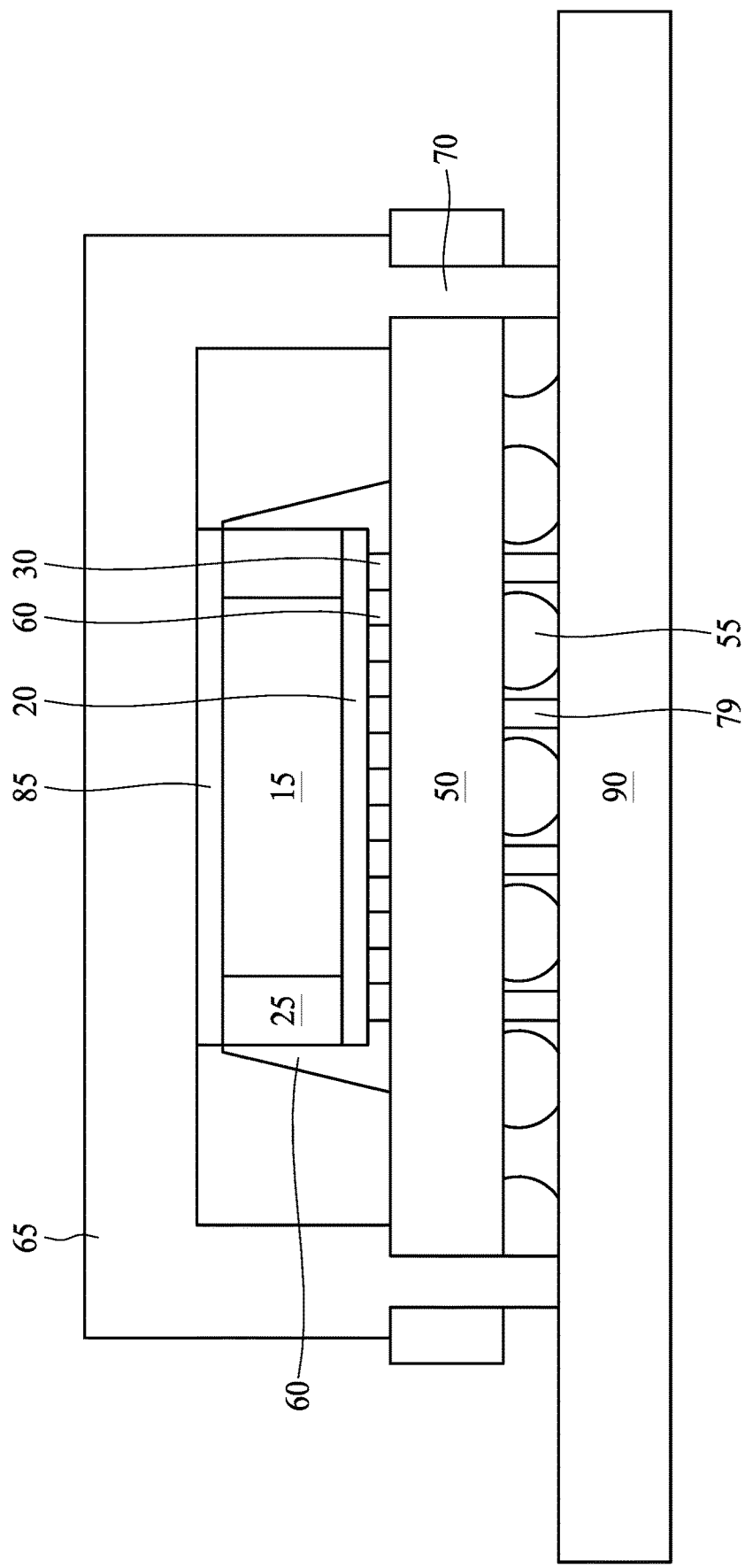
FIG. 13 illustrates a semiconductor device package according to an embodiment of the present disclosure.

FIG. 13 shows a package lid with spacers according to embodiments of the present disclosure. Materials, configurations, dimensions, structures, conditions and operations the same as or similar to those explained with FIGS. 1-12 may be employed in the following embodiments, and some of the explanations may be omitted.

In the foregoing embodiments, the spacers 70 are disposed to surround the ball grid array 55. When the size of the semiconductor chip 15 is large, the center portion of the package substrate may not adequately supported by the spacers 70 to maintain a uniform gas distance between the package substrate 50 and the printed circuit board 90.

In some embodiments, one or more extra spacers 79 are disposed between the package substrate 50 and the printed circuit board 90, as shown in FIG. 13. In some embodiments, the extra spacers 79 are made of aluminum, copper, nickel, cobalt, and alloys thereof, or other thermally conductive materials. In some embodiments, the extra spacers 79 are made of Cu alloys, such as CuMo, CuW, or CuBe. In some embodiments, the extra spacers 79 are made of a composite material, including silicon carbide, aluminum nitride, graphite, and the like. In some embodiments, the extra spacers 79 are made of a composite material, including ceramic, silicon carbide, aluminum nitride, graphite, and the like. In some embodiments, the extra spacers 79 are made of the same material as the package lid 65 or the open lid 80. In other embodiments, the extra spacers 79 are made of a different material than the package lid 65 or the open lid 80. In such a case, the rigidness of the extra spacers 79 is smaller or greater than the rigidness of the package lid 65 or the open lid 80.

When the extra spacers 79 are made of a conductive material, the extra spacers 79 are disposed not to touch the solder balls 55 of the ball grid array, in some embodiments. When the extra spacers 79 are made of an insulating material, the extra spacers 79 touch or do not touch the solder balls 55 of the ball grid array, in some embodiments. When multiple extra spacers 79 are disposed, the extras spacers 90 are arrange to be a point symmetric with respect to the center of the package substrate 50 (or the center of the semiconductor chip 15) in some embodiments.

According to embodiments of the present disclosure, since spacers integrally formed with a package lid or an open lid, which pass through the package substrate to touch down the printed circuit board, deformation of the package during a thermal process can effectively be prevented or suppressed.

In accordance with one aspect of the present disclosure, a semiconductor package includes a semiconductor chip disposed over a first main surface of a first substrate, a package lid disposed over the semiconductor chip, and spacers extending from the package lid through corresponding holes in the first substrate. The spacers enter the holes at a first main surface of the first substrate and extend beyond an opposing second main surface of the first substrate. In one or more of the foregoing and following embodiments, the spacers are made of a same material as the package lid. In one or more of the foregoing and following embodiments, the spacers and the package lid form a unitary component. In one or more of the foregoing and following embodiments, the package lid is made of aluminum, aluminum alloy, copper, copper alloy, stainless steel or ceramic. In one or more of the foregoing and following embodiments, the copper alloy is selected from the group consisting of CuMo, CuW, and CuBe. In one or more of the foregoing and following embodiments, the package lid is in contact with the semiconductor chip through a thermal interface material. In one or more of the foregoing and following embodiments, the semiconductor package further includes a ball grid array disposed over the second main surface of the first substrate. In one or more of the foregoing and following embodiments, the ball grid array has a pitch ranging from 200 µm to 800 µm. In one or more of the foregoing and following embodiments, the first substrate is disposed over a second substrate. In one or more of the foregoing and following embodiments, the spacers contact a main surface of the second substrate. In one or more of the foregoing and following embodiments, the second substrate is a printed circuit board. In one or more of the foregoing and following embodiments, the first substrate and the second substrate are separated by a distance ranging from 20 µm to 800 µm. In one or more of the foregoing and following embodiments, the spacers are disposed at least corners of the package lid.

In accordance with another aspect of the present disclosure, a semiconductor package includes a semiconductor chip disposed over a first main surface of a first substrate, a package lid in a ring or a frame shape having an opening and disposed over the semiconductor chip, a second substrate disposed below the first substrate, and spacers extending from the package lid through corresponding holes in the first substrate. The spacers enter the holes at a first main surface of the first substrate and extend beyond an opposing second main surface of the first substrate and contact a main surface of the second substrate. In one or more of the foregoing and following embodiments, the semiconductor chip is an image sensor or a light sensor. In one or more of the foregoing and following embodiments, the package lid is made of aluminum, aluminum alloy copper, copper alloy, stainless steel or ceramic. In one or more of the foregoing and following embodiments, the second substrate includes holes to which the spacers are fitted. In one or more of the foregoing and following embodiments, the semiconductor package further includes a transparent cover disposed in or over the opening.

In accordance with another aspect of the present disclosure, in method of manufacturing a semiconductor package, a package lid is positioned over a chip disposed over a first main surface of a first substrate. The package lid has a plurality of spacers extending from a periphery of the package lid, and the first substrate has a plurality holes corresponding to the plurality of spacers. The spacers are positioned into the holes so that the spacers pass through a first main surface of the substrate and extend beyond a second opposing main surface of the substrate, to form a packaged semiconductor device. In one or more of the foregoing and following embodiments, the packaged semiconductor device is attached to a second substrate by a surface mounting process.

An embodiment of the disclosure is a semiconductor package, including a chip disposed over a first main surface of a substrate. A package lid or ring is disposed over the semiconductor chip, and spacers extend from the package lid or ring through corresponding holes in the substrate. The spacers enter the holes at a first main surface of the substrate and extend beyond an opposing second main surface of the substrate. In an embodiment, the spacers are made of a same material as the package lid or ring. In an embodiment, the spacers and the package lid or the ring form a unitary component. In an embodiment, the package lid or ring is made of copper, copper alloy, or stainless steel. In an embodiment, the copper alloy is selected from the group consisting of CuMo, CuW, and CuBe. In an embodiment, the package lid is in contact with the semiconductor chip through a thermal interface material. In an embodiment, the semiconductor package includes a ball grid array disposed over a second main surface of the substrate. In an embodiment, the ball grid array has a pitch ranging from 200 μm to 800 μm. In an embodiment, the substrate is disposed over a second substrate. In an embodiment, the spacers contact a main surface of the second substrate. In an embodiment, the second substrate is a printed circuit board. In an embodiment, the substrate and the second substrate are separated by a distance ranging from 20 μm to 800 μm. In an embodiment, the substrate and the second substrate are separated by a distance ranging from 50 μm to 500 μm. In an embodiment, the substrate and the second substrate are separated by a distance ranging from 100 μm to 400 μm. In an embodiment, the spacers are disposed around a periphery of the package lid or ring. In an embodiment, the package lid or ring is substantially rectangular shaped in plan view. In an embodiment, there are three spacers on each side of the package lid or ring. In an embodiment, each of the spacers are spaced-apart from an adjacent spacer by a substantially same distance around a periphery of the package lid or ring. In an embodiment, spacers are located at corners of the package lid or ring. In an embodiment, a diameter of the holes ranges from 100 μm to 1,000 μm. In an embodiment, a diameter of the spacers are 10 μm to 50 μm smaller than the diameter of the holes. In an embodiment, the semiconductor chip is an integrated fan-out chip, system on a chip, wafer-level chip scale package, or chip on wafer on substrate. In an embodiment, the semiconductor package includes an under-fill layer between the semiconductor chip and the substrate.

Another embodiment of the disclosure is a method, including positioning a package lid or ring over a chip disposed over a first main surface of a substrate. The package lid or ring has a plurality of spacers extending from a periphery of the package lid or ring, and the substrate has a plurality holes corresponding to the plurality of spacers. The spacers are positioned into the holes so that the spacers pass through a first main surface of the substrate and extend beyond a second opposing main surface of the substrate. In an embodiment, the method includes drilling the plurality of holes through the substrate before positioning the package lid or ring over the semiconductor chip. In an embodiment, the method includes forming a layer of thermal interface material over the semiconductor chip before positioning the package lid or ring over the semiconductor chip. In an embodiment, the package lid contacts the semiconductor chip through the thermal interface material. In an embodiment, the method includes supplying an under-fill material between the semiconductor chip and the substrate before positioning the package lid or ring over the semiconductor chip. In an embodiment, the method includes soldering the semiconductor chip to the first main surface of the substrate before positioning the package lid or ring over the substrate. In an embodiment, the substrate includes a ball grid array disposed over a second main surface of the substrate. In an embodiment, the ball grid array has a pitch ranging from 200 μm to 800 μm. In an embodiment, the method includes attaching the substrate to a first main surface of a second substrate. In an embodiment, the substrate is soldered to the first main surface of the second substrate. In an embodiment, the second substrate is a printed circuit board. In an embodiment, the plurality of spacers contact the first main surface of the second substrate. In an embodiment, the substrate and the second substrate are separated by a distance ranging from 20 μm to 800 μm. In an embodiment, the substrate and the second substrate are separated by a distance ranging from 50 μm to 500 μm. In an embodiment, the substrate and the second substrate are separated by a distance ranging from 100 μm to 400 μm. In an embodiment, the spacers are made of a same material as the package lid or ring. In an embodiment, the spacers and the package lid or the ring form a unitary component. In an embodiment, the package lid or ring are made of copper, copper alloy, or stainless steel. In an embodiment, the copper alloy is selected from the group consisting of CuMo, CuW, and CuBe. In an embodiment, the package lid or ring is substantially rectangular shaped in plan view. In an embodiment, there are three spacers on each side of the package lid or ring. In an embodiment, each of the plurality of spacers are spaced-apart from an adjacent spacer by a substantially same distance around a periphery of the package lid or ring. In an embodiment, spacers are located at corners of the package lid or ring. In an embodiment, a diameter of the holes ranges from 100 μm to 1,000 μm. In an embodiment, a diameter of the spacers are 10 μm to 50 μm smaller than the diameter of the holes. In an embodiment, the semiconductor chip is an integrated fan-out chip, system on a chip, wafer-level chip scale package, or chip on wafer on substrate.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor package, the method comprising:
    positioning a package lid over a chip disposed over a first main surface of a first substrate, wherein the package lid has a wall portion and a plurality of spacers extending from the wall portion, and the first substrate has a plurality of holes corresponding to the plurality of spacers and a solder material is disposed over the semiconductor chip;
    positioning the spacers into the plurality of holes so that the plurality of spacers pass through, from the first main surface, the first substrate and extend beyond a second opposing main surface of the first substrate, and the solder material contacts the package lid; and
    melting the solder material by applying heat through the package lid, to form a packaged semiconductor device, wherein:
    a diameter of the plurality of spacers is smaller than a width of the wall portion, and
    an outer surface of the wall portion is flush with an outermost portion of the plurality of spacers, or an inner surface of the wall portion is flush with an innermost portion of the plurality of spacers.

2. The method of claim 1, wherein the package lid is made of aluminum, aluminum alloy, copper, copper alloy, stainless steel or ceramic.

3. The method of claim 1, wherein the package lid is made of a copper alloy selected from the group consisting of CuMo, CuW, and CuBe.

4. The method of claim 1, wherein an under-fill material is disposed between a bottom of the chip and the first main surface of a first substrate.

5. The method of claim 4, wherein the under-fill material is disposed over side faces of the chip.

6. The method of claim 5, wherein the under-fill material is as a silica filled epoxy resin.

7. The method of claim 1, wherein a ball grid array is disposed over the second main surface of the first substrate.

8. The method of claim 7, wherein the ball grid array has a pitch ranging from 200 μm to 800 μm.

9. A method of manufacturing a semiconductor package, the method comprising:
    positioning a package lid over a chip disposed over a first main surface of a first substrate, wherein the package lid has a wall portion and a plurality of spacers extending from the wall portion, and the first substrate has a plurality of holes corresponding to the plurality of spacers, a solder material is disposed over the semiconductor chip and a ball grid array is disposed over a second main surface of the first substrate;
    positioning the spacers into the plurality of holes so that the plurality of spacers pass through, from the first main surface, the first substrate and extend beyond the second main surface of the first substrate, and the solder material contacts the package lid;
    melting the solder material by applying heat through the package lid, to form a packaged semiconductor device; and
    mounting the packaged semiconductor device to a second substrate such that the ball grid array and the plurality of spacers contact the second substrate, wherein:
    a diameter of the plurality of spacers is smaller than a width of the wall portion, and
    an outer surface of the wall portion is flush with an outermost portion of the plurality of spacers, or an inner surface of the wall portion is flush with an innermost portion of the plurality of spacers,
    heat is applied to at least partially melt solder balls of the ball grid array to bond the solder balls to electrodes disposed over the second substrate, and
    the solder material is one of SnAgCu, CuSnNi, AgCuSbSn or CuSn.

10. The method of claim 9, wherein a pressure is applied to the solder balls of the ball grid array.

11. The method of claim 10, wherein while the pressure is applied, a variation in distance of a gap between the second main surface of the first substrate and the second substrate is 1% to 5% of an average distance of the gap.

12. The method of claim 9, wherein an extension amount of the plurality of spacers from the second main surface is greater than a thickness of the ball grid array.

13. The method of claim 12, wherein the second substrate includes a plurality of recesses to which the plurality of spacers are fitted.

14. The method of claim 13, wherein an end of the plurality of spacers has a thin portion that fits a corresponding one of the plurality of recesses.

15. A method of manufacturing a semiconductor package, the method comprising:
    positioning a package lid over a chip disposed over a first main surface of a first substrate, wherein the package lid has a plurality of spacers extending from a periphery of the package lid, and the first substrate has a plurality holes corresponding to the plurality of spacers; and
    positioning the spacers into the holes so that the spacers pass through a first main surface of the substrate and extend beyond a second opposing main surface of the substrate, to form a packaged semiconductor device,
    wherein the chip is an image sensor or a light sensor.

16. The method of claim 15, wherein the package lid is made of aluminum, aluminum alloy, copper, copper alloy, stainless steel or ceramic.

17. The method of claim 15, wherein the package lid in a ring or a frame shape having an opening.

18. The method of claim 17, wherein a transparent cover is disposed over the opening.

19. The method of claim 15, further comprising mounting the packaged semiconductor device to a second substrate.

20. The method of claim 19, wherein heat and pressure are applied when mounting the packaged semiconductor device to the second substrate.

* * * * *